United States Patent
Spowart et al.

(10) Patent No.: US 9,025,333 B1
(45) Date of Patent: May 5, 2015

(54) TUNABLE THERMAL SWITCH

(75) Inventors: Jonathan E. Spowart, Dayton, OH (US); Wynn S. Sanders, King of Prussia, PA (US); Garth B. Wilks, Dayton, OH (US)

(73) Assignee: The United States of America as Represented by the Secretary of the Airforce, Washington, DC (US)

( * ) Notice: Subject to any disclaimer, the term of this patent is extended or adjusted under 35 U.S.C. 154(b) by 428 days.

(21) Appl. No.: 13/302,535

(22) Filed: Nov. 22, 2011

Related U.S. Application Data

(60) Provisional application No. 61/484,380, filed on May 10, 2011.

(51) Int. Cl.
*H05K 7/20* (2006.01)
*F28F 13/00* (2006.01)

(52) U.S. Cl.
CPC . *F28F 13/00* (2013.01); *H05K 7/20* (2013.01)

(58) Field of Classification Search
CPC ..... F28F 13/00; F25D 19/006; H05K 7/2039; H05K 7/20
USPC ...................... 337/333, 335; 165/276; 62/383; 361/704, 707
See application file for complete search history.

(56) References Cited

U.S. PATENT DOCUMENTS

| | | | | | |
|---|---|---|---|---|---|
| 2,949,283 | A | * | 8/1960 | Smith | 165/277 |
| 4,032,071 | A | * | 6/1977 | Imoto | 236/101 E |
| 4,339,740 | A | * | 7/1982 | Greenhalgh | 337/39 |
| 4,345,234 | A | * | 8/1982 | Reich | 337/336 |
| 5,379,601 | A | * | 1/1995 | Gillett | 62/51.1 |
| 7,154,369 | B2 | * | 12/2006 | Dietz et al. | 337/394 |
| 8,339,787 | B2 | * | 12/2012 | Tsai | 361/704 |
| 8,549,864 | B2 | * | 10/2013 | Langdon et al. | 60/782 |

* cited by examiner

*Primary Examiner* — Anatoly Vortman
(74) *Attorney, Agent, or Firm* — AFMCLO/JAZ; Frederic Sinder

(57) ABSTRACT

A new multifunctional, thermoelastic cellular structure is described. The new structure provides tunable thermal transport behaviors particularly important for thermal switching. In its simplest example embodiment of a single or unit cell, opposing bimetallic elements bend in response to temperature changes and, below a tunable switching temperature, are separated in an open or insulating position and, at and above the switching temperature, bend to come into contact in a closed or conducting position. Multiple cells are combined in different lattice arrays to create structures that are both switchable and load bearing. The cells can be switched by both temperature and other external fields.

4 Claims, 15 Drawing Sheets

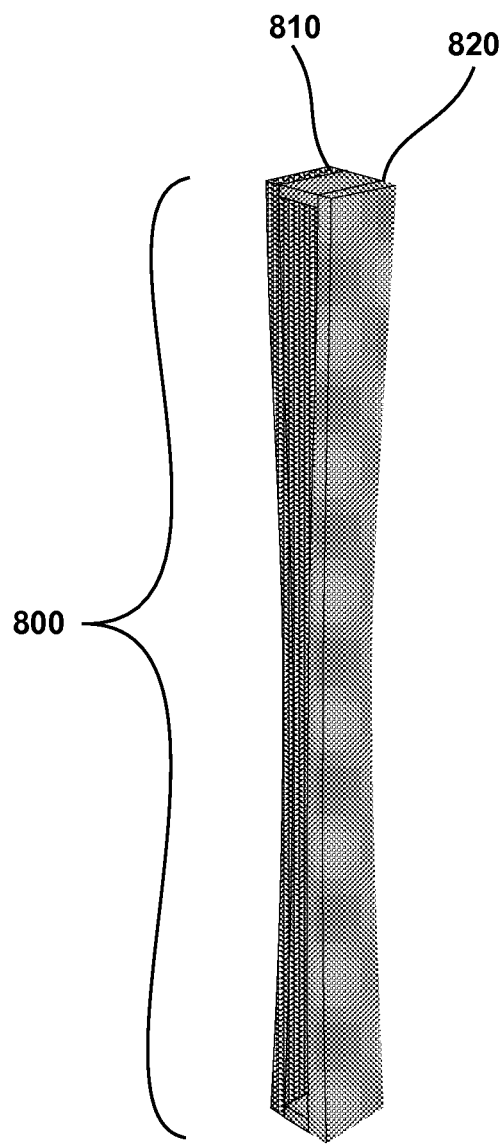 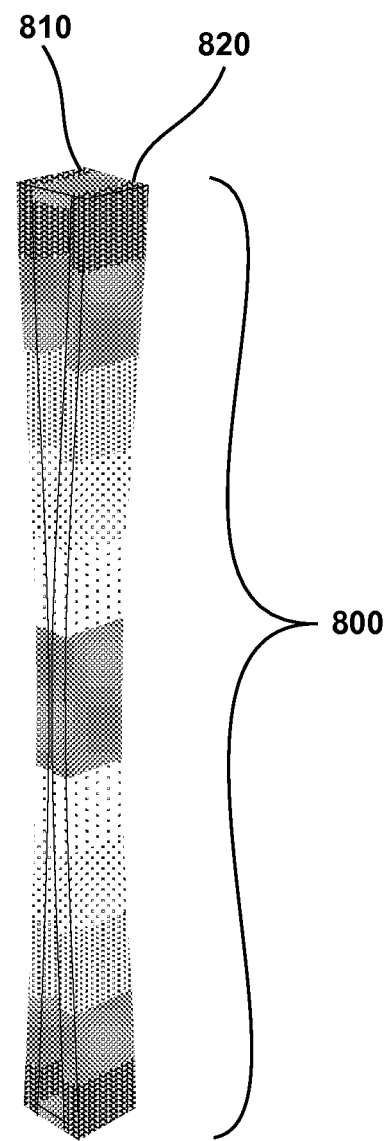
OPEN
$K_{th}$= 3.7 W/M.K
CLOSED
$K_{th}$= 3.7 W/M.K
Fig. 8
Fig. 9

TUNABLE THERMAL SWITCH

CROSS REFERENCE TO RELATED PATENT APPLICATIONS

This application claims priority under 35 U.S.C. §119(e) from U.S. provisional application 61/484,380, filed May 10, 2011 and titled "Method for Designing Cellular Materials with Tunable Thermal Transport Behaviors." The invention description contained in that provisional application is incorporated by reference into this description.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to multifunctional, thermoelastic cellular structures with tunable thermal transport behaviors, and particularly to tunable thermal switches.

Thermal management is a critical component for successful operation of mechanical, chemical, electrical and electronic devices. In a conference paper titled "Thermal Applications for Advanced Metallic Materials," Jonathan E. Spowart, SAMPE 2007, Baltimore Md., Jun. 3-7, 2007, one of the co-inventors for the present invention described the then current state of the art for advanced metallic structures and their possible use for thermal management.

Thermal management is particularly important in the areas of hypersonic vehicle thermal management and spacecraft thermal management, as well as for directed energy weapons and for protection from the effects of such weapons.

An example of an important thermal management problem is in satellite thermal control systems (TCS). Satellite thermal control systems conduct waste heat from hot satellite components to cooling radiators to prevent overheating. When a satellite is in eclipse (out of the sunlight), the cooling effect of the radiators can be too much, requiring use of so-called survival batteries to power heating units to protect the satellite components from damage.

Survival batteries are heavy and require replacement. Solutions to this problem include mechanical shutters that cover the radiators during eclipse periods. While not as heavy as batteries, moving mechanical devices are notoriously unreliable in an in-orbit space environment.

There is, therefore, a need for new and improved components for use in thermal management systems.

SUMMARY OF THE INVENTION

The present invention provides new solutions for thermal management by using bimetallic elements in a variety of configurations for controlling thermal transport, primarily as tunable thermal switches.

A primary teaching of the present invention is the use of a pair of opposing bimetallic elements, each bimetallic element having a first layer having a first coefficient of thermal expansion and high thermal conductivity and a second layer having a second coefficient of thermal expansion less than the first coefficient of thermal expansion and a high thermal conductivity, whereby each bimetallic element will bend with increasing temperature such that, at a switching temperature, corresponding first layers will touch and transfer thermal energy from one bimetallic element to the other. The bimetallic elements will similarly separate with decreasing temperature at the switching temperature and prevent transfer of thermal energy.

The new thermal switches can be turned on and off, and tuned, according to the influence of a variety of externally applied fields such as, but not limited to, thermal, electrical, magnetic, heat flux, mechanical stress and multiple combinations of those and other fields. Control of thermal transport is primarily achieved by changing the shape, or geometry, of individual cells in response to such external fields.

Another primary teaching of the present invention is combining unit cells of the described thermal switches in cellular arrays or lattices, adding multifunctionality in that the thermal switches can also serve as load-bearing elements.

Another teaching of the present invention is bimetallic elements of different shapes and configurations, including the shape of a truncated tetrahedral.

Another teaching of the present invention is modeling of unit cells as equivalent thermal circuits.

BRIEF DESCRIPTION OF THE DRAWINGS

The teachings of the present invention will be better understood from the following drawings illustrating various aspects and example embodiments of the invention and its teachings.

FIG. 8 shows the results of a computer model of another example embodiment of the present invention in an open configuration.

FIG. 9 shows the results of a computer model of the FIG. 8 example embodiment in a closed configuration.

DETAILED DESCRIPTION

A primary object of the present invention is to provide cellular structures with tunable thermal transport properties, thermal transport properties that can be varied over a range according to the influence of an external applied field.

Figure 1:
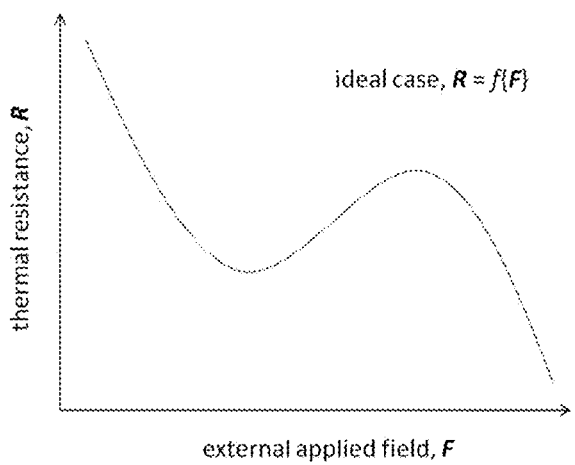
FIG. 1 is a graph of ideal characteristics of a structure with tunable thermal transport properties.

FIG. 1 is a graph of desired ideal characteristics of a structure with tunable thermal transport properties. F is an external field, given as temperature in these examples, but can include magnetic, electric, mechanical stress and combinations of those fields. Similarly in these examples, thermal transport is defined as thermal resistance R, but could also be described by thermal conductivity $K_{th}$ or thermal diffusivity $\alpha$. The ideal behavior would be a single-valued dependency of R on F as shown in FIG. 1.

Figure 2:
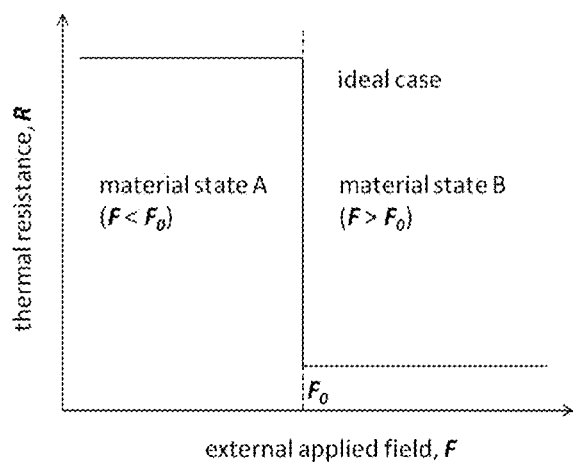
FIG. 2 is a graph of ideal thermal switch or thermal transistor functional behavior for a switch that is off or insulating at low temperatures or low fields and on or conducting at high temperatures or high fields.
Figure 3:
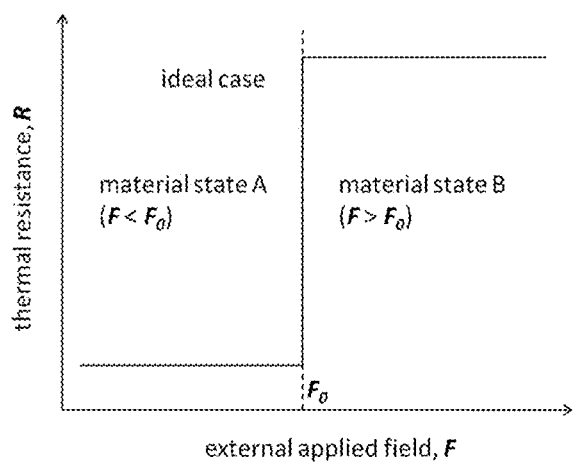
FIG. 3 is a graph of ideal thermal switch or thermal transistor functional behavior for a switch that is on or conducting at low temperatures or low fields and off or insulating at high temperatures or high fields.

For the specific purpose of a thermal switch, the ideal characteristics of a tunable structure are shown in FIGS. 2 and 3. FIG. 2 shows a switch that is off or insulating at a low temperature, or low field, and on or conducting at a high temperature, or high field. FIG. 3 shows the reverse, a switch that is on or conducting at low temperatures or low fields and off or insulating at high temperatures or high fields.

The teachings of the present invention include switching a thermal switch on and off by varying the geometry and configuration of bimetallic elements in a bimetallic cellular structure. The properties and geometry of the cellular structure can be tailored so that switching field $F_0$ is within the useful range for the specific intended application.

An important use of the teachings of the present invention is as a thermal isolation mechanism for thermal management purposes. The ability to have a tunable "thermal short" in a structure will allow more efficient thermal management for a variety of aerospace applications, including thermal protection systems for hypersonic vehicles, electronics and sensor packaging, and spacecraft thermal bus structures.

Additionally, by combining such bimetallic cellular structures into cellular lattices or arrays, they are made multifunctional so that, for example, they will be able to transmit loads between various parts of a larger structure, minimizing the addition of parasitic weight, particularly for space vehicles.

The teachings of the present invention uses combinations of bimetallic and insulating structures to construct bimetallic cellular structures or solids, lightweight structures that possess the ability to tune their thermal transport behavior in response to an external temperature or other field. These structures are made of unit cells which contain an amount of void volume that allows the bimetallic elements, such as strips, to change shape so that they either "make" or "break" thermal contact with each other, creating a thermal switch functionality in at least one direction in the structure. Other configurations that have thermal switching in more than one direction are shown in FIGS. 15-18 as alternative example embodiments of the present invention.

Figure 4:
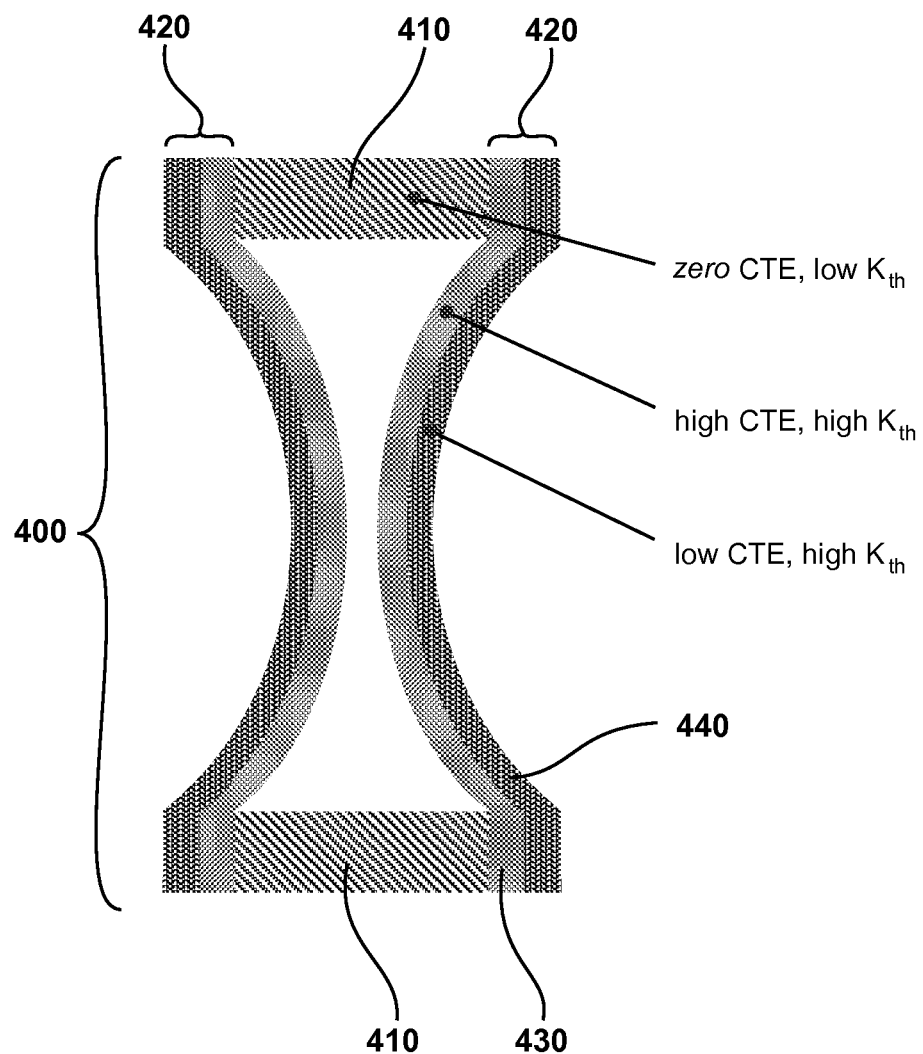
FIG. 4 is a representational view of an example embodiment of a thermal switch according to the teachings of the present invention.
Figures 5, 6:
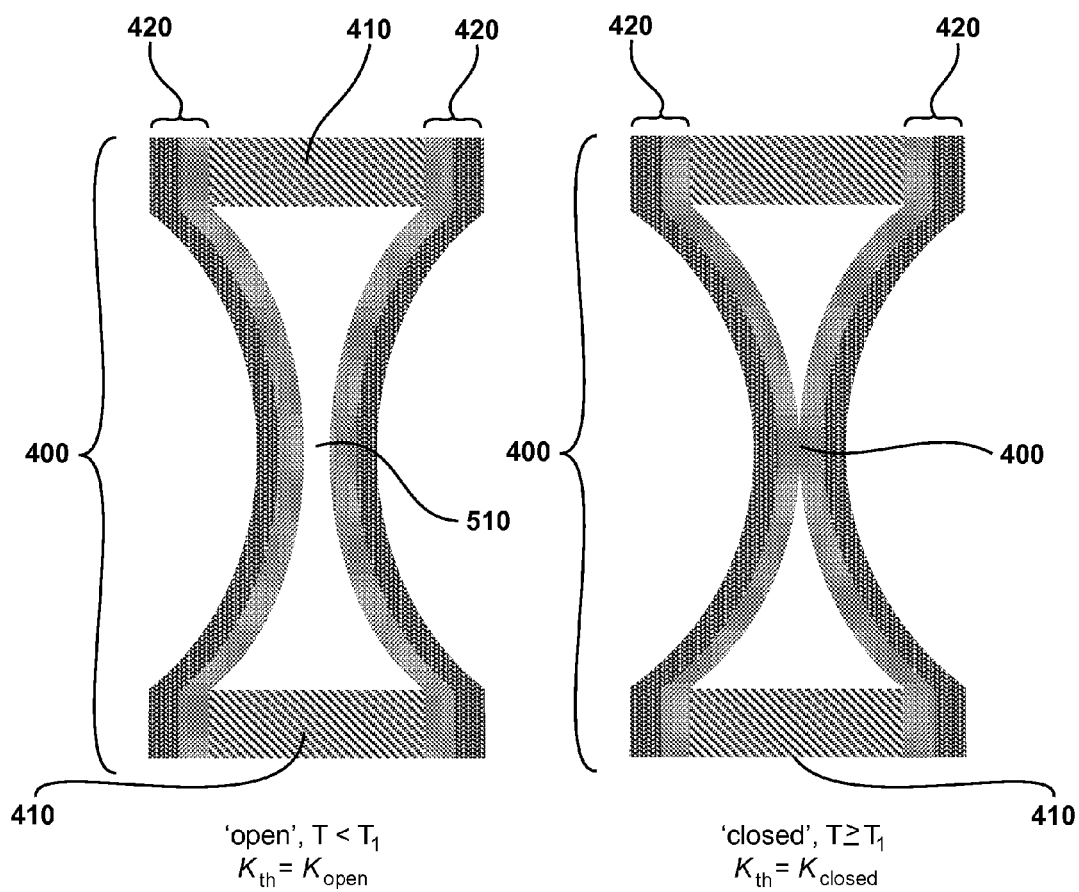
FIG. 5 is a representational view of the FIG. 4 thermal switch in an open or off configuration.
FIG. 6 is a representational view of the FIG. 4 thermal switch in a closed or on configuration.

FIG. 4 shows an example configuration of bimetallic elements and insulating standoffs according to the teachings of the present invention that has been shown (via computational modeling) to provide the desired switching function. FIGS. 5 and 6 show one possible mode of operation of the bimetallic elements to achieve this switching function. A conceptual arrangement of a number of similar bimetallic elements in a cellular array is given in FIG. 7. This arrangement will provide thermal switching parallel to the long axis of the structure.

FIG. 4 shows a single unit cell 400 comprising two low $K_{th}$ insulating standoffs 410, two high $K_{th}$ bimetallic elements 420 made from one high $K_{th}$, high coefficient of thermal expansion ((CTE) metallic structure 430 bonded to one high $K_{th}$, low coefficient of thermal expansion metallic structure 440.

FIG. 5 shows one mode of operation of bimetallic unit cell 400 having a switching temperature $T_1$. FIG. 5 represents the FIG. 4 thermal switch in an open or off configuration at temperatures below $T_1$.

FIG. 6 represents the FIG. 4 thermal switch in a closed or on configuration at temperatures at and above $T_1$.

A thermal switch is characterized by its switching ratio $\beta$, the ratio of the thermal conductivity in its closed or on configuration to the thermal conductivity in its open or off position. The switching ratio is dependent on cell geometry, such as width, length and curvature, and the thermal transport properties $K_{th}$ of the structures making up bimetallic element 420 and insulating standoffs 410. It's desirable to maximize this ratio by varying the cell geometry and structure properties, either individually or in combination, in order to achieve a widest utility for these structures in thermal switching applications. A thermal switch is further characterized by its switching temperature, or other field value, at which the structure transitions between open and closed. Switching temperature $T_1$ is dependent on cell geometry, such as gap, curvature and length; bimetal layer thickness ratio $h_1/h_2$ and structure properties such as elastic modulus, Poisson's ratio and coefficient of thermal expansion. The switching temperature $T_1$ can thus be targeted to specific applications by varying the cell geometry and structure properties, either individually or in combination.

Figure 7:
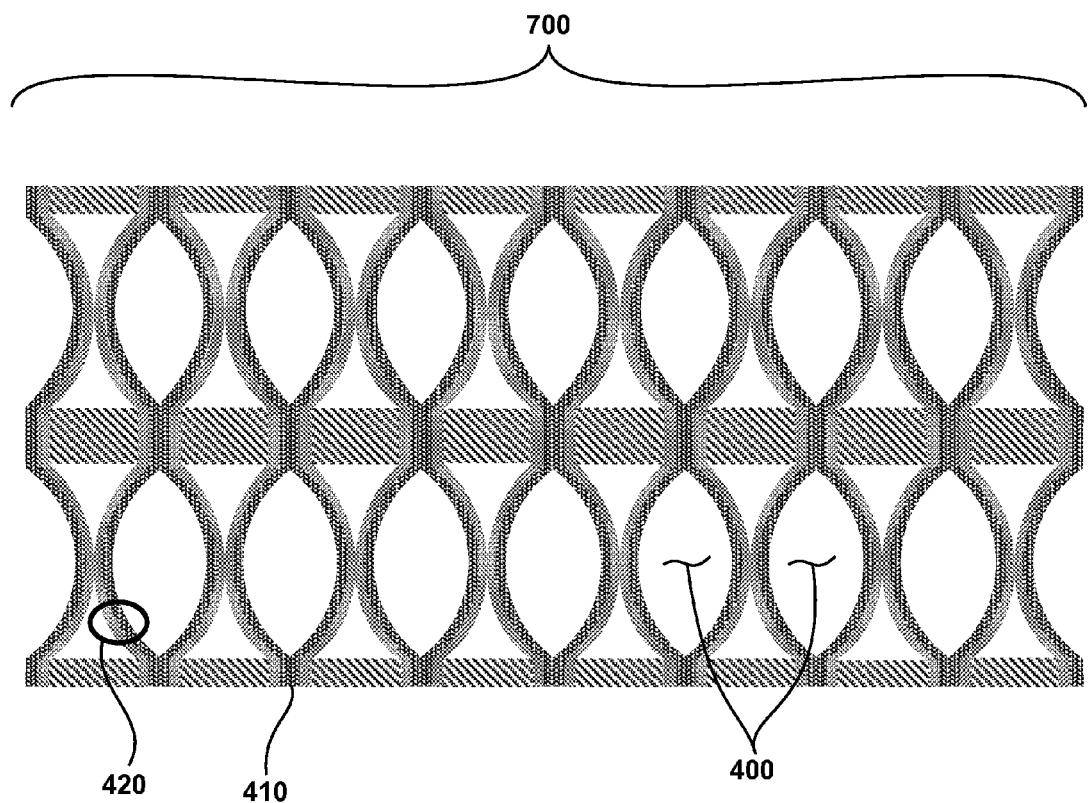
FIG. 7 is a representational view of an example embodiment of multiple thermal switches arranged as unit cells in a rectangular array or lattice.

FIG. 7 is a representational view of an example embodiment of multiple thermal switches 400 arranged as unit cells in a rectangular array or lattice 700 to provide thermal switching parallel to the long axis of the structure, and in this particular example embodiment, high thermal conduction transverse to this axis.

Cellular structure 700 is stiff, capable of carrying structural mechanical loads with minimal deflection. The load-bearing properties of cellular structure 700 are dependent on the structure properties of bimetallic elements 420 and insulating standoffs 410, as well as the geometry of bimetallic unit cells 400 and the arrangement of the cells in a lattice such as lattice 700. The teachings of the present invention, therefore, can produce structures which are multifunctional in that they can provide a useful load-bearing capability in conjunction with their thermal switching capability.

FIG. 8 and FIG. 9 show the results of a computer model of a representative bimetallic unit cell 800 comprising two low $K_{th}$ insulating standoffs 810 made of zirconium oxide and two high $K_{th}$ bimetallic elements 820 made from a high $K_{th}$, high coefficient of thermal expansion metallic structure, aluminum in this example, bonded to one high $K_{th}$, low coefficient of thermal expansion metallic structure, steel in this example.

Figure 10:
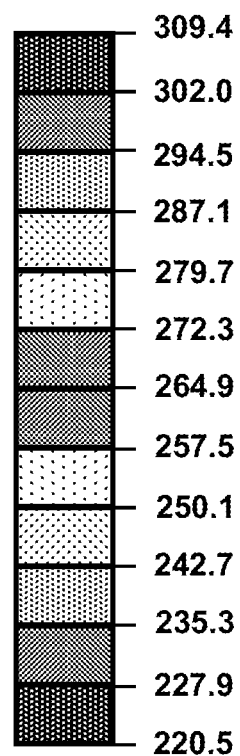
FIG. 10 is a chart in degrees Kelvin of the temperature contours in FIGS. 8 and 9.

FIG. 10 is a chart in degrees Kelvin of the temperature contours in FIGS. 8 and 9.

FIG. 8 shows the results of an open configuration where the overall thermal conductivity of each unit cell is calculated to be $K_{th}$=3.7 W/mK. FIG. 9 shows the results of the closed configuration where the overall thermal conductivity of the unit cell is calculated to be $K_{th}$=23.9 W/mK. The switching ratio β is therefore given by β=23.9/3.7≈6.5. Alternative geometries, such as unit cell height, unit cell width, bimetallic element thickness, standoff dimensions, etc., will give different values for switching ratio β, allowing for optimization of this parameter for widest utilization. The temperature at which switching occurs between open and closed configurations in this example is calculated to be $T_1$≈225K. Alternative geometries of gap, curvature, length; bimetal layer thickness ratio $h_1/h_2$ and structure properties, such as elastic modulus, Poisson's ratio and coefficient of thermal expansion will result in different values of $T_1$, thereby allowing the switching temperature to be optimized for a wide range of applications.

The overall thermal transport properties of individual bimetallic unit cells and cellular structures made of multiple unit cells is heavily dependent on the thermal interfacial resistance between the two inner layers of the opposing bimetallic elements when they come together under thermal contact in response to the shape change driven by a change in temperature (or other field value). It is, therefore, important to optimize such factors as surface roughness, friction, interfacial chemistry and geometrical contact area to maximize thermal conductance across this interface. Surface coatings such as liquid crystal phases, chemical treatments, thermal interface structures and mechanical locking mechanisms can be used to enhance thermal conduction, without limiting the necessary bimetallic response. In addition, the interfacial thermal conductance is strongly influenced by the normal contact force across the interface. The geometry of a unit cell and the mechanical and thermoelastic properties of its constituent structures (bimetals and standoffs) can be modified in order to apply a greater amount of normal force across this interface when in the closed configuration. This will increase the thermal conductivity of the cellular structure whilst simultaneously increasing the switching ratio β. Both maximum thermal conductivity and the switching ratio can be maximized by these methods.

Figure 11:
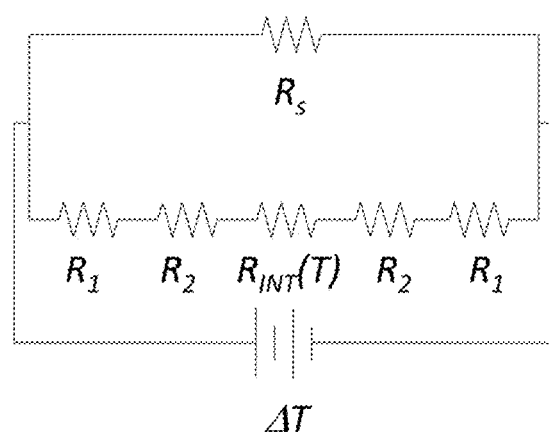
FIG. 11 is a diagram of an equivalent thermal circuit for the example embodiment of the unit cell shown in FIG. 4.

One example method for computing the overall thermal conductivity of a unit cell according to the teachings of the present invention is by using an equivalent thermal circuit as shown in FIG. 11 and Equation (1). $R_S$ is the thermal resistance of the insulating standoffs and $R_1$ and $R_2$ the respective thermal resistances of the high $K_{th}$, low coefficient metallic structure (such as steel) and the high $K_{th}$, high coefficient of thermal expansion metallic structure (such as aluminum). $R_{INT}(T)$ is the temperature-dependent interfacial thermal contact resistance between two opposing bimetallic elements. The overall thermal gradient which drives the heat flux across the unit cell is given by ΔT.

$$\frac{1}{R^*} = \frac{1}{R_S} + \frac{1}{2(R_1 + R_2) + R_{INT}} \quad (1)$$

R* is the overall thermal resistance of the unit cell. In an open configuration, for example, at temperatures below $T_1$, $R_{INT \to \infty}$. The overall thermal resistance of the unit cell is given by $R^* = R_S$ in this configuration, and the switching ratio β by Equation (2).

$$\beta = 1 + \frac{R_S}{2(R_1 + R_2) + R_{INT}} \quad (2)$$

To design a cellular structure with a maximum switching ratio, it is important to consider such factors as: (i) increasing the thermal resistance of the standoffs; (ii) decreasing both the thermal resistance of the bimetallic elements and the interfacial thermal resistance between their contacting surfaces; (iii) increasing the interfacial thermal resistance between the standoffs and the bimetallic elements to provide a thermally weak interface by using, for example, a glue or a bonded or porous interface between the two, thereby increasing the effective $R_S$ in Equation (2), and; (iv) reducing the cross-sectional area of the standoff relative to the cross-sectional area of the bimetallic strip, while still maintaining the mechanical properties necessary to perform the structural functions of separating the bimetallic elements and keeping them in the correct positional relationship for proper actuation, possibly under an applied load.

As discussed in the Background of the Invention, an important example application for a cellular structure with tunable thermal properties is to mitigate reliance on survival heaters and survival batteries for a spacecraft or satellite thermal control system. The thermal control system must maintain the temperature of critical components on the spacecraft, such as sensors and other instruments, within strict limits. This is typically achieved using radiators which radiate the spacecraft thermal loads to the space environment very efficiently during the warm phase in the orbit, for example when the vehicle is in direct sunlight. However, during the cold phase of a spacecraft orbit, for example when the vehicle is out of direct sunlight, the same radiator will cool much too efficiently, requiring the use of a survival heater to provide a temporary sustaining source of heat and maintain the lower temperature limit. Some existing designs of spacecraft radiators use mechanical louvers to change the emissivity of the radiator surface, thereby effectively limiting its efficiency in the cold phase. This concept requires mechanical moving parts which are prone to reliability issues. Alternatively, variable-emissivity coatings may be used for virtually the same purpose, but these are expensive, technologically challenging and may suffer environmental degradation in an on-orbit space environment. Another alternative is the use of thermal energy storage systems on board a spacecraft. These use chemical compounds and mixtures having large latent heats of fusion or vaporization per unit mass, with phase transition temperatures within the range of operating temperatures of the spacecraft. During the warm phase of an orbit, the thermal energy storage system heats up and undergoes a phase transition, such as melting, which absorbs heat from the spacecraft. During the cold phase of the orbit, the thermal energy storage system cools down below the phase transition temperature and releases heat, working in the same mode as a thermal survival battery. One limitation of this approach is the amount of heat that can be stored per unit mass is limited, and the response time of the system can also be slow. Additionally, and importantly, the transition temperature cannot be arbitrarily tailored. Further, the performance of this type of thermal energy storage system can degrade over time due to chemical and or physical changes in the phase-change structure. In the case of a vapor-based phase change, the containment of significant volumes of vapor under pressure is technologically challenging.

Figure 12:
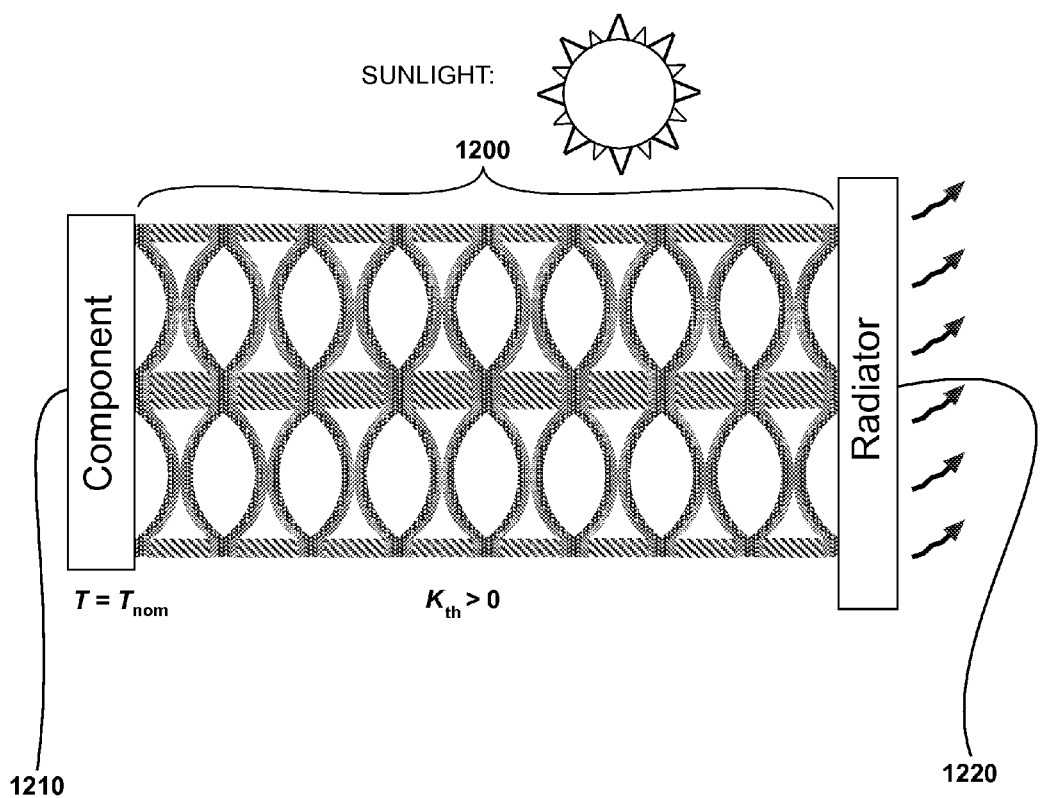
FIG. 12 is a representative view of a satellite thermal control system for controlling thermal loads on spacecraft components showing the use of an example embodiment of the present invention during normal operation of the satellite thermal control system in sunlight.

An advantage of the teachings of the present invention is its ability to tune thermal conduction through a structure in response to an external thermal field. In FIG. 12, a spacecraft thermal control system 1200 conducts waste heat from a hot spacecraft or satellite component 1210 to a cooling radiator 1220 to prevent the component from overheating during use.

orthogonal directions 1510 and 1520, according to the different unit cell configurations outlined in Table 1.

The two distinct thermal switching directions 1510 and 1520, which may or may not be dependent on each other, depending on the precise geometry and structures employed in the unit cells lying parallel to the 1510 and 1520 directions. Lattice structure 1500 includes two different unit cells 1530 and 1540, which may or may not be equivalent in terms of their thermoelastic response and switching temperatures.

TABLE 1

| Case | $T_1, T_2$ | Thermo-elastic. behavior of unit cell I | Thermo-elastic behavior of unit cell II | Response, $T < T_1$ | Response, $T_1 \leq T \leq T_2$ | Response, $T > T_2$ |
|---|---|---|---|---|---|---|
| A-1 | $T_1 < T_2$ | $T < T_1; K_{th} = K_{open}$ | $T < T_2; K_{th} = K_{open}$ | $K_1 = K_{open}$ | $K_1 = K_{closed}$ | $K_1 = K_{closed}$ |
|     |             | $T \geq T_1; K_{th} = K_{closed}$ | $T \geq T_2; K_{th} = K_{closed}$ | $K_2 = K_{open}$ | $K_2 = K_{open}$ | $K_2 = K_{closed}$ |
| A-2 | $T_1 < T_2$ | $T < T_1; K_{th} = K_{closed}$ | $T < T_2; K_{th} = K_{open}$ | $K_1 = K_{closed}$ | $K_1 = K_{open}$ | $K_1 = K_{open}$ |
|     |             | $T \geq T_1; K_{th} = K_{open}$ | $T \geq T_2; K_{th} = K_{closed}$ | $K_2 = K_{open}$ | $K_2 = K_{open}$ | $K_2 = K_{closed}$ |
| A-3 | $T_1 < T_2$ | $T < T_1; K_{th} = K_{open}$ | $T < T_2; K_{th} = K_{closed}$ | $K_1 = K_{open}$ | $K_1 = K_{closed}$ | $K_1 = K_{closed}$ |
|     |             | $T \geq T_1; K_{th} = K_{closed}$ | $T \geq T_2; K_{th} = K_{open}$ | $K_2 = K_{closed}$ | $K_2 = K_{closed}$ | $K_2 = K_{open}$ |
| A-4 | $T_1 < T_2$ | $T < T_1; K_{th} = K_{closed}$ | $T < T_2; K_{th} = K_{closed}$ | $K_1 = K_{closed}$ | $K_1 = K_{open}$ | $K_1 = K_{open}$ |
|     |             | $T \geq T_1; K_{th} = K_{open}$ | $T \geq T_2; K_{th} = K_{open}$ | $K_2 = K_{closed}$ | $K_2 = K_{closed}$ | $K_2 = K_{open}$ |

Figure 13:
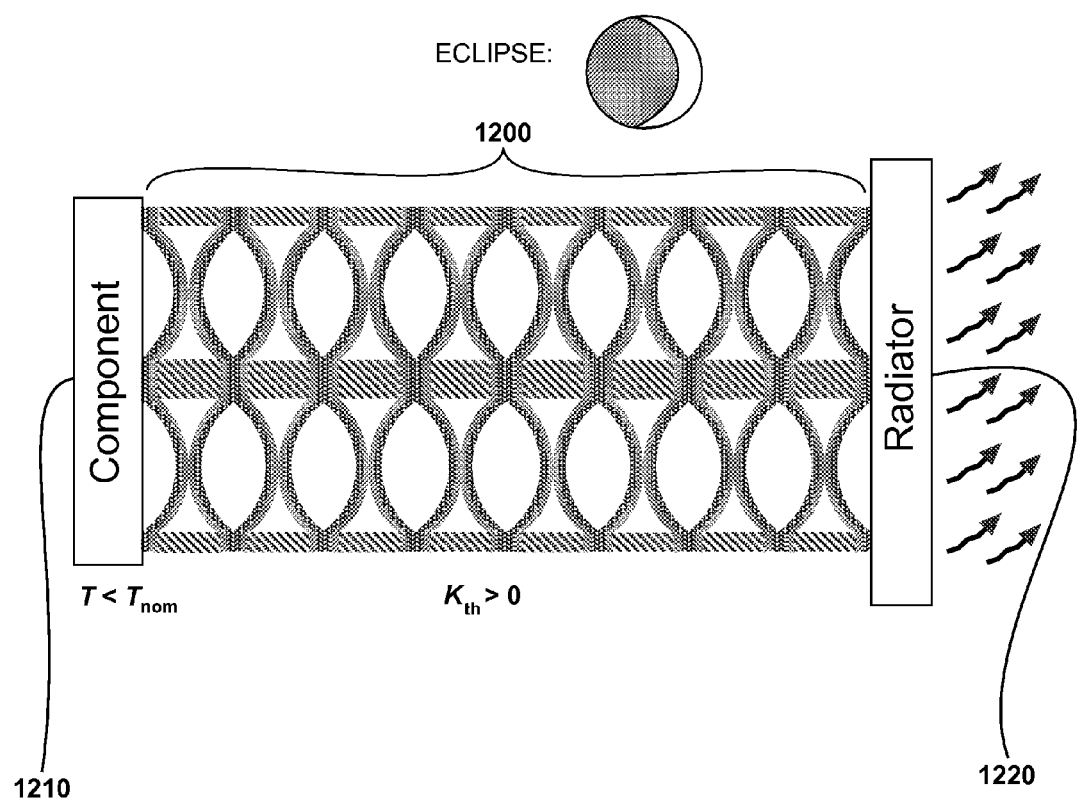
FIG. 13 is a representative view of the satellite thermal control system of FIG. 12 showing the need for survival batteries during an eclipse period without the use of the present invention.
Figure 14:
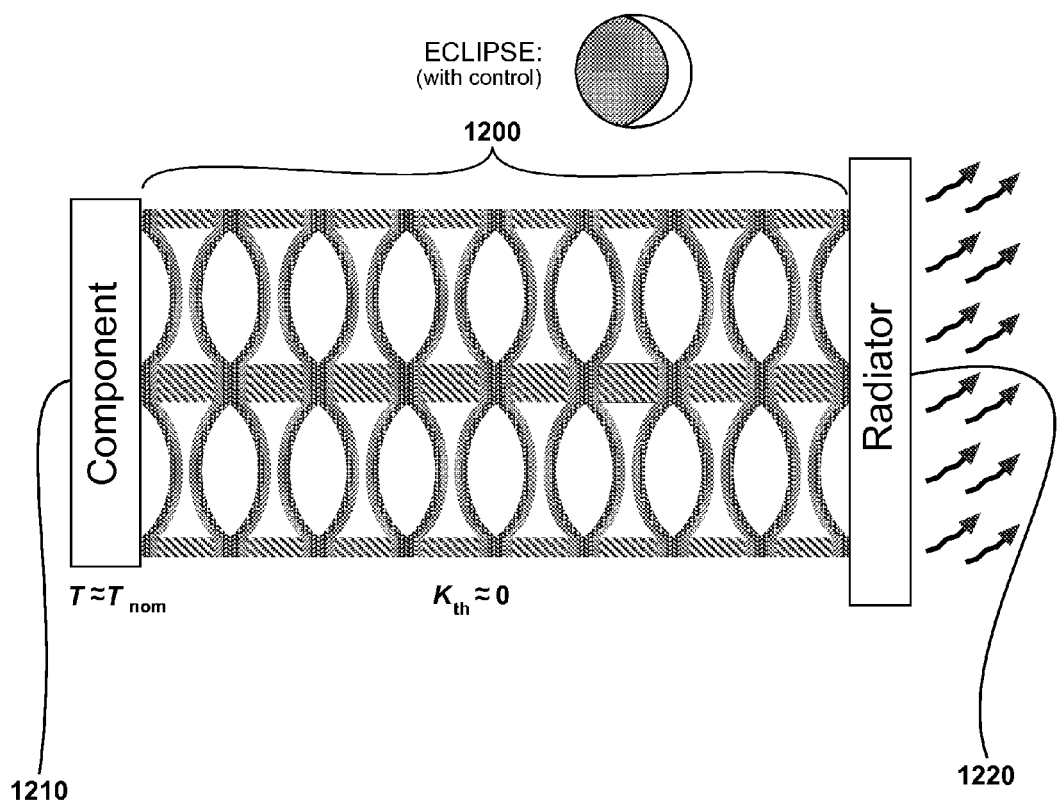
FIG. 14 is a representative view of the satellite thermal control system of FIGS. 12 and 13 showing a use of the example embodiment of the present invention during an eclipse period to eliminate the need for survival batteries.
Figure 15:
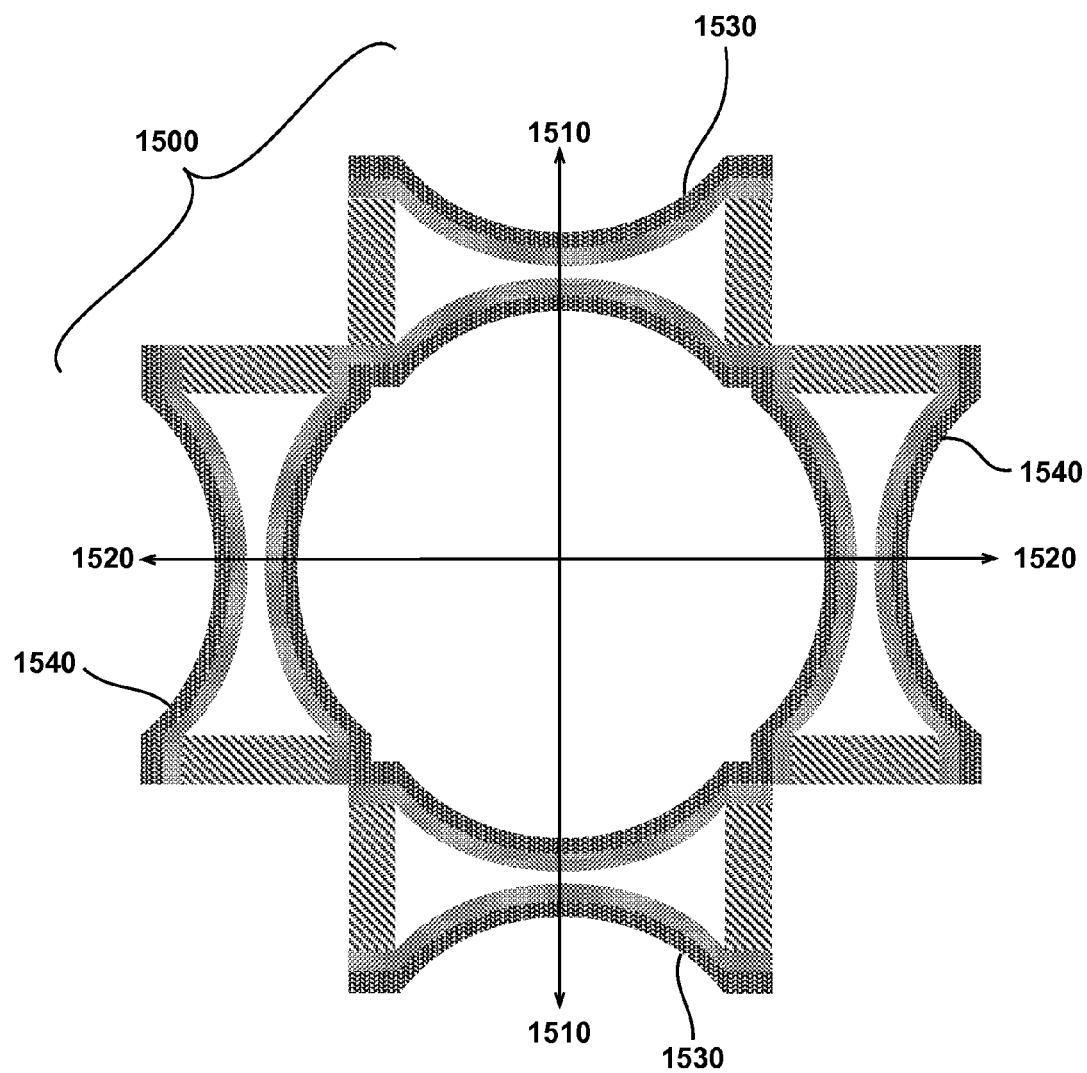
FIG. 15 is a representative view of an alternative repeating lattice example embodiment of the present invention having two distinct thermal switching directions.

When the spacecraft is in eclipse (out of the sunlight), shown in FIG. 13, the cooling effect of the radiator can be too much, pulling the temperature of the component below its nominal temperature, which can cause damage. As discussed, the typical solution is to employ survival batteries on board the spacecraft to power a heating unit which keeps the component above any damaging low temperatures. These add weight to the spacecraft, which is at a premium, and only have a finite lifetime. An advantage of the present invention is that in response to the cold temperatures during eclipse, bimetallic cellular structure 1200 can switch to an insulating mode as shown in FIG. 14, thereby removing the thermal short between radiator 1220 and component 1210 and preventing low temperatures on component 1210. Once the spacecraft moves again into sunlight, the bimetallic cellular structure can heat up again, restoring the conductive thermal pathway between hot component 1210 and radiator 1220.

The mode of operation depicted in FIG. 14 represents a new way of controlling thermal loads on spacecraft which does not require any power to actuate, nor does it require any additional components or structural weight to be added to the spacecraft, such as survival batteries, attendant wiring, etc. The present invention deals primarily with the optimized design of lightweight, multifunctional (thermal plus load-bearing) structures ideally suited for applications in spacecraft thermal control systems.

The bimetallic unit cell design depicted in FIGS. 4-6 is one of many possible unit cells that can perform the fundamental bimetallic shape-change needed to perform a thermal switching function according to the teachings of the present invention. Many more unit cells structures can perform the same function, possibly with more optimized results in terms of switching ratio and temperature, or other field, range of operation. Other unit cells structures may be able to bear a greater degree of mechanical load in either an open or closed configuration, including shear loading and torque, and which could be made from alternative insulating and conductive structures.

In the same way, the rectangular lattice structure of FIG. 7 is not the only suitable lattice structure for a two- or three-dimensional bimetallic cellular structure. The two-dimensional rectangular lattice structure 1500 of FIG. 15 can exhibit two distinct thermal switching functions in two Table 1 shows possible combinations of different thermoelastic response bimetallic unit cells arranged in orthogonal directions, and their effect on thermal conductivity of the bimetallic cellular structure shown in FIG. 15. There are 12 different combinations of either open or closed conductivities in the two orthogonal directions, depending on the temperature of operation.

In cases A-1 thru A-4, subscript 2 can be replaced with subscript 1 when the two switching temperatures are reversed, that is, when $T_1 > T_2$. For cases where $T_1 = T_2 = T^*$, the 12 different combinations become degenerate and collapse down to only 8 possible combinations of either open or closed conductivities in the two orthogonal directions in the structure. In general, if the two different bimetallic unit cells are chosen such that $K_{open}(I) \neq K_{open}(II)$ and/or $K_{closed}(I) \neq K_{closed}(II)$ and/or $T_1 \neq T_2$, then a structure with a highly tunable anisotropic thermal transport response can be designed, with utility over a wide variety of thermal transport and thermal management applications. In the same manner, 3-D combinations of unit cells could also be envisioned which could provide tunable thermal transport responses in 3 different directions, shown in tensor notation in Equation 3.

$$K_{th}(T) = \begin{bmatrix} K_1(T) \\ K_2(T) \\ K_3(T) \end{bmatrix} \quad (3)$$

In general, the thermal conductivity tensor of the structure $K_{th}$ could be designed to be fully tunable over a wide range of temperatures, depending on its 3-D architecture, lattice and combination of structures used for the unit cells in the structure. These alternative modes of the present invention could include incorporating graded-microstructure or multilayer structures as alternative structures for the bimetallic element, which would perform the same function of adopting geometric curvature in response to changes in temperature (or other externally-applied field). The graded-microstructure or multilayer structures may or may not be metallic, and could include porous or composite structures comprising two or more phases.

A further alternative mode of the present invention can include actuation of the thermal switching function by externally-applied stresses. For example, a stress applied to the schematic unit cell shown in FIG. 15 in the 1510 direction would cause unit cells 1530 to close while keeping unit cells 1540 open, thereby increasing $K_2$ whilst not affecting $K_1$. Conversely, a stress applied in the 1520 direction, or $\sigma_2$, would cause the opposite effect. A shear stress applied in the plane of FIG. 15, or $\sigma_{12}$, would cause a combination of these two effects. The thermal transport response in the presence of external stresses follows Equation 4.

$$K_{th}(T,\sigma) = \begin{bmatrix} K_1 \\ K_2 \\ K_3 \end{bmatrix}(T) = \begin{bmatrix} a_{11}(T) & a_{12}(T) & a_{13}(T) \\ a_{21}(T) & a_{22}(T) & a_{23}(T) \\ a_{31}(T) & a_{32}(T) & a_{33}(T) \end{bmatrix} \begin{bmatrix} \sigma_1 \\ \sigma_2 \\ \sigma_3 \end{bmatrix} \quad (4)$$

$\alpha_{ij}$ are either experimentally-determined or theoretically derived coupling coefficients which relate the applied stress in each direction to the thermal conduction in each direction, as a function of temperature. In this way, highly-tunable 3-D thermal transport properties can be designed into a structure.

A further alternative mode of the present invention would use non-linear elastic deformations of the bimetallic elements to perform the actuation function. Such 'snap-through' effects have previously been applied to thermostatic elements in order to improve responsiveness, and similar benefits are anticipated for the present invention.

Figure 16:
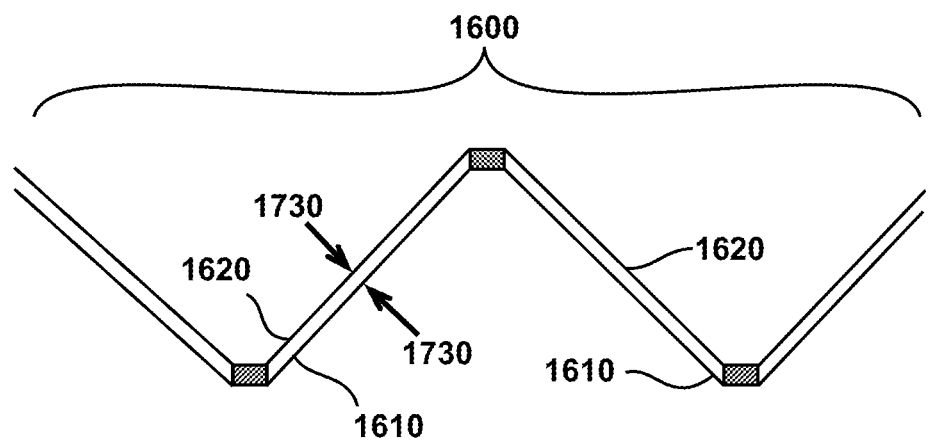
FIG. 16 is a two-dimensional cross-section representative view of another alternative geometry example embodiment of the present invention based on truncated tetrahedral units showing the tetrahedral unit cells in an open or insulating configuration.
Figure 17:
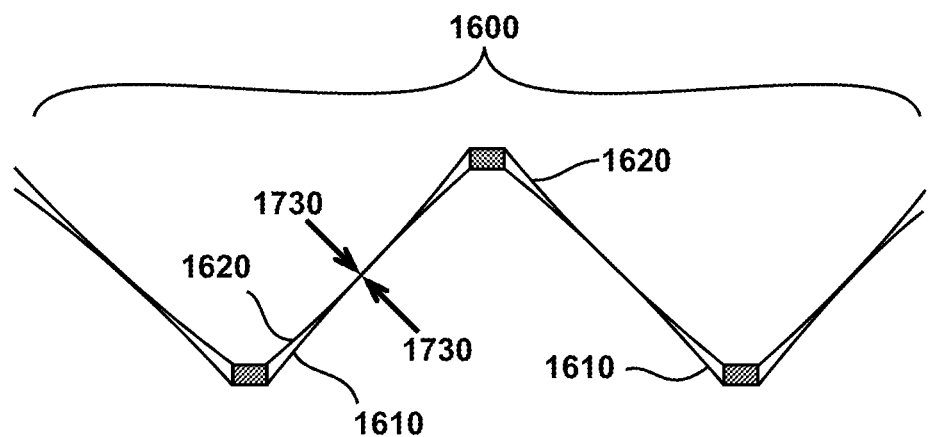
FIG. 17 is a two-dimensional cross-section representative view of the truncated tetrahedral units of FIG. 16 in a closed or conducting configuration.

A further alternative mode according to the teachings of the present invention can utilize alternative geometries for the unit cells based on truncated tetrahedral elements. These shapes are highly-efficient for load bearing, and can be easily fabricated into structural panels for increased utility as multifunctional structures. FIGS. 16 and 17 shows a two-dimensional cross-sectional representation of a truncated tetrahedral unit 1600, showing the positions of bimetallic elements 1610 and 1620 in a FIG. 16 open 1630 or insulating configuration and a FIG. 17 closed or conducting configuration 1730.

Figure 18:
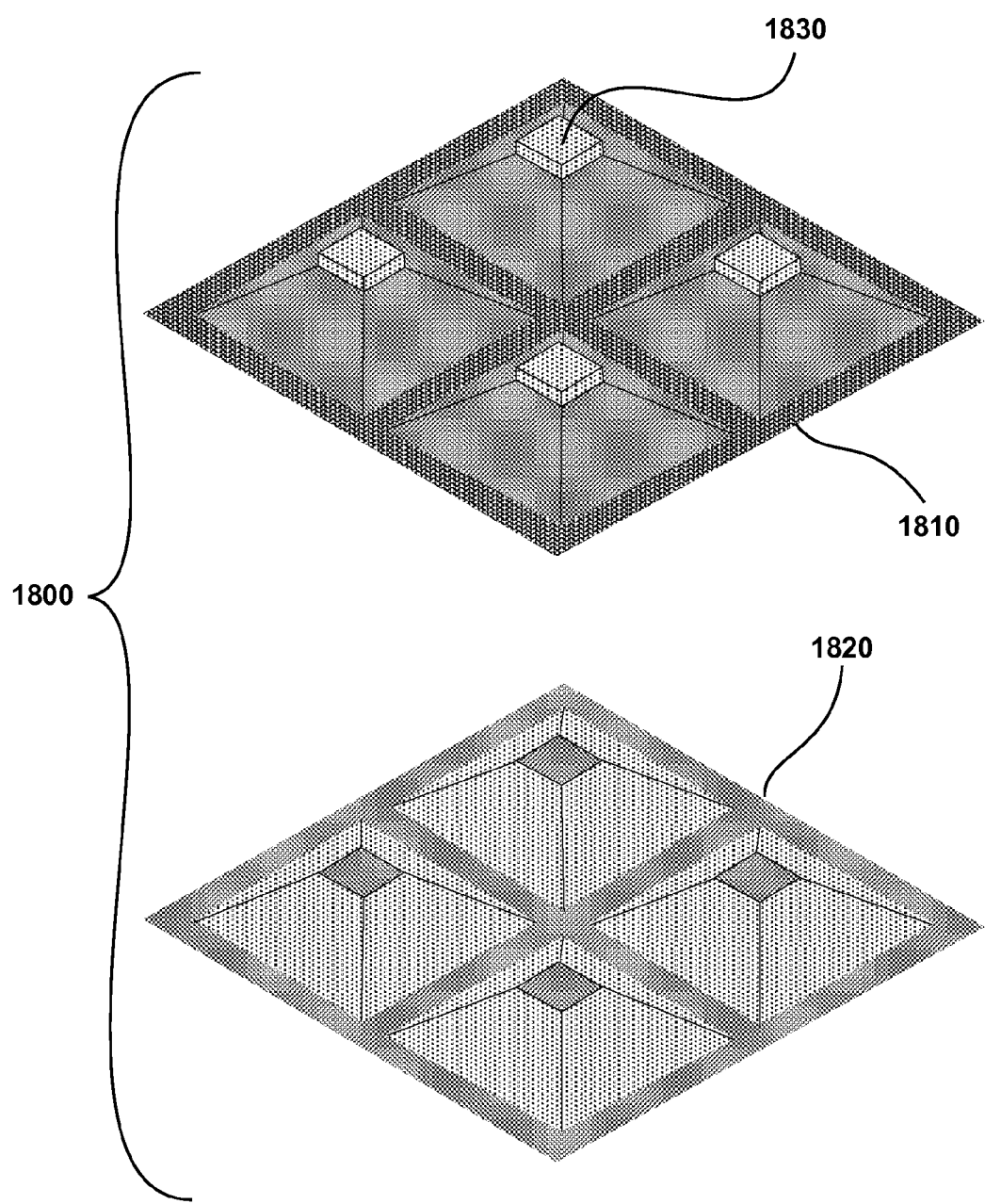
FIG. 18 is a three-dimensional representative view of the truncated tetrahedral units of FIGS. 16 and 17 showing upper and lower panels and insulating standoffs.

FIG. 18 shows an isometric projection of a complete three-dimensional tetrahedral bimetallic structure 1800 including upper panel 1810, lower panel 1820 and insulating standoffs 1830.

The teachings of the disclosed new multifunctional, thermoelastic cellular structures, with tunable thermal transport behaviors, will find application in other areas where switch-like controls need to be light weight, controllable by the same field or other parameter being controlled, or switched, and multifunctional, such as a load bearing structural element.

Example areas where these teachings can be used include the commercial power electronics and transportation industries. The ability to tune thermal transport properties in a material or structure can reduce the thermal loads experienced by individual components in a power electronics system, dramatically increasing reliability and offering a commercial competitive advantage. This same ability to change the thermal transport properties of a material or structure can lead to more efficient thermal management strategies for vehicles, in turn reducing the amount of waste heat released to the environment and thereby reducing fuel costs.

While the present invention is described in the title as a thermal switch, its expected initial primary and initial use, it is not so limited, but referred to as such only to aid searching and understanding. Those with skill in the art of the invention, and in other art areas, will readily see that its teachings are not so limited, even to the point of not being limited to its broader description as a multifunctional, thermoplastic cellular structure.

Various modifications to the invention as described may be made, as might occur to one with skill in the art of the invention, within the scope of the claims. Therefore, all contemplated example embodiments have not been shown in complete detail. Other embodiments may be developed without departing from the spirit of the invention or from the scope of the claims.

We claim:

1. A thermal switch, comprising:
   (a) a pair of bimetallic elements in a spaced relationship, each bimetallic element comprising:
      (i) a first layer having a first coefficient of thermal expansion and high thermal conductivity;
      (ii) a second layer having a second coefficient of thermal expansion less than the first coefficient of thermal expansion and high thermal conductivity; and,
      (iii) a first end and a second end;
   (b) a pair of insulating standoffs, wherein corresponding first ends of each bimetallic strip are attached at and separated by a first insulating standoff and corresponding second ends of each bimetallic strip are attached at and separated by a second insulating standoff; and,
   (c) wherein each bimetallic element is constrained by its attachments at its ends to the insulating standoffs such that corresponding first layers will bend toward each other with increasing temperature and, at a switching temperature, will touch and transfer thermal energy from one bimetallic element to the other.

2. The thermal switch of claim 1, wherein multiple pairs of bimetallic elements are arranged as cells in a lattice structure.

3. The thermal switch of claim 1, wherein each bimetallic element has a shape of a truncated tetrahedral.

4. A method for determining the switching ratio $\beta$ of a unit cell for a thermal switch, the thermal switch comprising a pair of bimetallic elements in a spaced relationship, each bimetallic element including a first layer having a first coefficient of thermal expansion and high thermal conductivity; a second layer having a second coefficient of thermal expansion less than the first coefficient of thermal expansion and high thermal conductivity; a first end and a second end; a pair of insulating standoffs separating the bimetallic elements, wherein corresponding first ends of each bimetallic strip are attached at and separated by a first insulating standoff and corresponding second ends of each bimetallic strip are attached at and separated by a second insulating standoff; wherein each bimetallic element is constrained by its attachments at its ends to the insulating standoffs such that corresponding first layers will bend toward each other with increasing temperature and, at a switching temperature, will touch and transfer thermal energy from one bimetallic element to other; and, wherein $R_S$ is the thermal resistance of the insulating standoffs, $R_1$ is the thermal resistance of the first layer, $R_2$ the thermal resistance of the second layer and $R_{INT}$ the interfacial thermal contact resistance between the first and second layers; comprising the step of solving for $\beta$ using the equation:

$$\beta 1 + R_S/2(R_1+R_2)+R_{INT}.$$

* * * * *